(12) United States Patent
Liu et al.

(10) Patent No.: US 8,560,898 B2
(45) Date of Patent: Oct. 15, 2013

(54) ERROR CORRECTION METHOD AND ERROR CORRECTION APPARATUS UTILIZING THE METHOD

(75) Inventors: Pi-Hai Liu, Hsinchu County (TW); Chih-Ching Yu, Hsinchu (TW); Li-Lien Lin, Hsinchu (TW); Shih-Hsin Chen, Hsinchu County (TW); Shih-Ta Hung, Taoyuan County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 429 days.

(21) Appl. No.: 12/621,509

(22) Filed: Nov. 19, 2009

(65) Prior Publication Data

US 2010/0293431 A1 Nov. 18, 2010

Related U.S. Application Data

(60) Provisional application No. 61/178,145, filed on May 14, 2009.

(51) Int. Cl.
*H03M 13/05* (2006.01)

(52) U.S. Cl.
USPC .......................................................... 714/713

(58) Field of Classification Search
USPC .......................................................... 714/763
See application file for complete search history.

(56) References Cited

U.S. PATENT DOCUMENTS

| | | | |
|---|---|---|---|
| 6,108,811 A | 8/2000 | Nakamura | |
| 6,192,503 B1 * | 2/2001 | Chennakeshu et al. | 714/796 |
| 6,601,211 B1 * | 7/2003 | Norman | 714/773 |
| 7,043,679 B1 * | 5/2006 | Keltcher et al. | 714/763 |
| 7,111,225 B2 | 9/2006 | Coene | |
| 7,284,180 B2 * | 10/2007 | Takagi et al. | 714/755 |
| 7,430,701 B2 * | 9/2008 | Chen | 714/763 |
| 7,653,866 B2 * | 1/2010 | Takagi et al. | 714/784 |
| 7,849,379 B2 * | 12/2010 | Kang | 714/758 |
| 8,140,935 B2 * | 3/2012 | Hong et al. | 714/755 |
| 8,145,975 B2 * | 3/2012 | Lin et al. | 714/758 |
| 8,316,279 B2 * | 11/2012 | Kim et al. | 714/763 |
| 8,341,498 B2 * | 12/2012 | D'Abreu et al. | 714/766 |
| 8,418,026 B2 * | 4/2013 | D'Abreu et al. | 714/758 |
| 2002/0056065 A1 * | 5/2002 | Jung et al. | 714/758 |
| 2006/0184841 A1 | 8/2006 | Shieh | |
| 2010/0185923 A1 * | 7/2010 | Chappaz | 714/780 |

* cited by examiner

*Primary Examiner* — Amine Riad
(74) *Attorney, Agent, or Firm* — Winston Hsu; Scott Margo (57) ABSTRACT

An error correction method for correcting an first ECC code from a storage unit, comprising: (a) marking at least a first part of the first ECC code according to a correction result generated by correcting error of the first ECC code, to generate a first error correction reference information; and (b) marking at least a second part of the first ECC code according to the first error correction reference information to generate a second error correction reference information.

52 Claims, 12 Drawing Sheets

ERROR CORRECTION METHOD AND ERROR CORRECTION APPARATUS UTILIZING THE METHOD

CROSS REFERENCE TO RELATED APPLICATIONS

This application claims the provisional application, which is U.S. Provisional Application No. 61/178,145, filed 2009, May 14, and is included herein by reference.

BACKGROUND OF THE INVENTION

The present invention relates to an error correction method and an error correction apparatus utilizing the method, and particularly relates to an error correction method that can utilize recursive error correction and an error correction apparatus utilizing the method.

In a storage system such as an optical disc drive, many types of correcting errors may exist, such that a strong error correcting code structure is needed. Some storage systems will use multiplayer error correcting codes (MLECC) to have a strong correcting capability. For example, a CD system has two layers of error correction codes, C1 and C2. C1 is utilized to correct some random errors. Erasure flags will be indicated for uncorrectable bytes in the C1 code. When C2 is utilized for decoding, a byte in the uncorrectable C1 code will become a byte with erasure flag in a C2 code. By this way, the erasure flag can increase error correcting capability of C2.

Similarly, a DVD system has codes PI/PO. PI is utilized to correct some random errors. Erasure flags will be indicated for uncorrectable bytes in the PI code. When PO is utilized for decoding, a byte in the uncorrectable PI code will become a byte with erasure flag in a PO code. By this way, the erasure flag can increase error correcting capability of PO.

Figure 1:
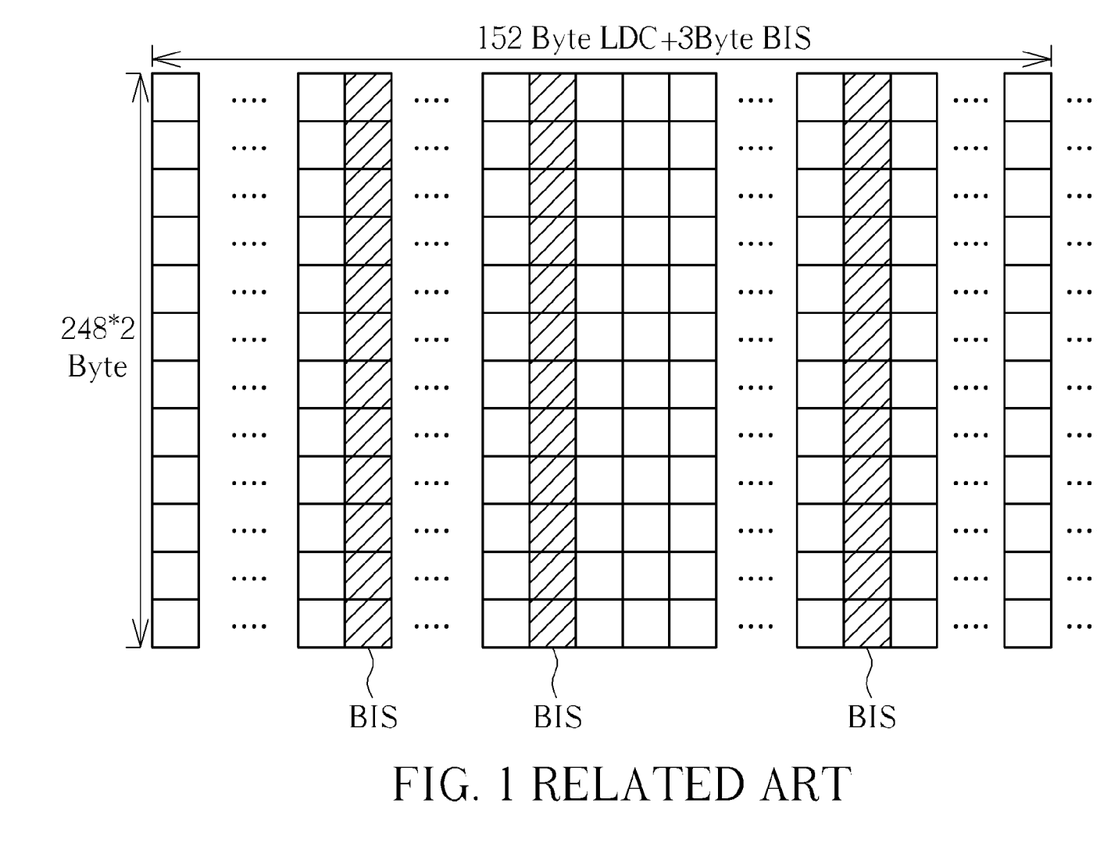
FIG. 1 is a schematic diagram illustrating a related art BD system structure.

However, there may still be uncorrectable bytes in PO code. Erasure flags will be indicated for uncorrectable bytes in PO code. In this case, a PI/PO recursive decoding flow will be taken. An uncorrectable byte in the PO code will become a byte with erasure flag in a PI code. After PI working, erasure flags will be indicated for bytes in PI code that can not be corrected by PI. Then PO is used for decoding, a byte in the uncorrectable PI code will become a byte with erasure flag in a PO code. Such recursive decoding process can be repeated many times and increase the system decoding capability. In a BD (blu-ray disc) system, an ECC cluster is constructed by LDC (Long Distance Code) code and BIS (Burst Indication Subcode) subcode, as shown in FIG. 1. A BIS-subcode is rare to be uncorrectable. The BD system can be regarded as a multi-code system though it does not use MLECC. If a BIS byte is erroneous and corrected, a BIS erasure flag will be indicated for the corrected BIS byte. An LDC erasure flag for an LDC byte will be generated by statistics on BIS erasure flag according to its neighboring BIS bytes. Then an LDC code is decoded according its LDC byte content and its LDC erasure flag. The process of generating LDC erasure flag from BIS subcode increases error correcting capability.

Figure 2:
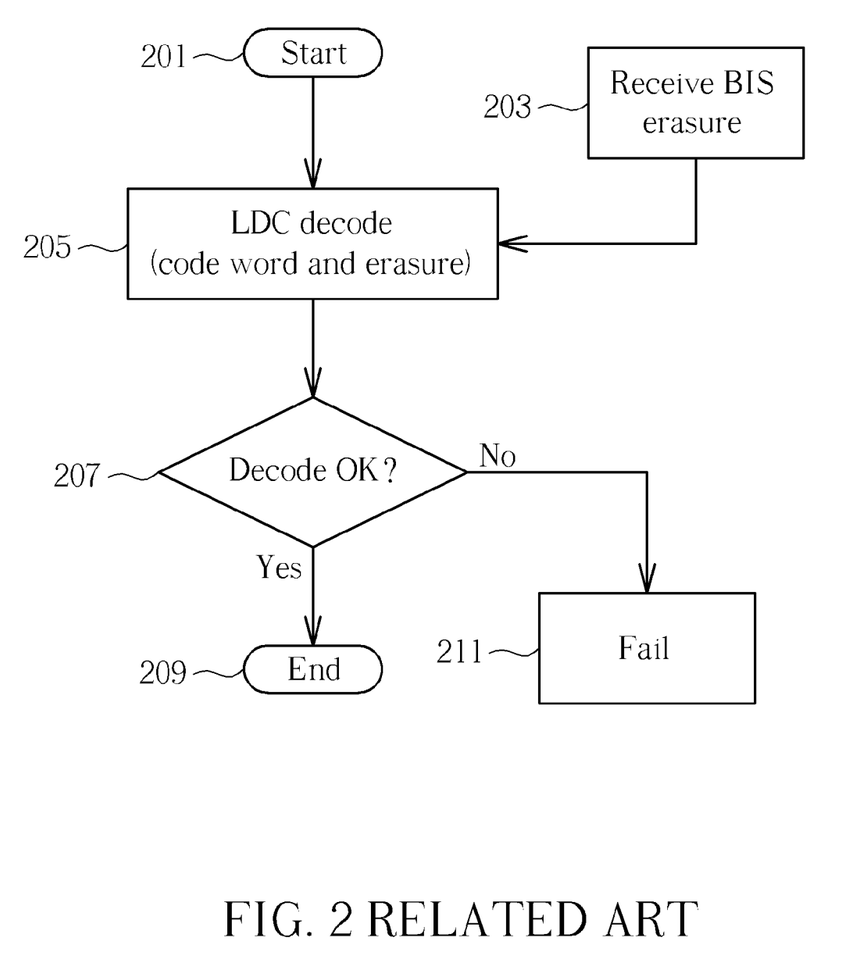
FIG. 2 is a flow chart illustrating the error correction operation of a related art BD system.

FIG. 2 is a flow chart illustrating the error correction operation of the BD system. The operation includes:

Step 201
Start.
Step 203
Receive BIS erasure.
Step 205
Perform LDC decoding (i.e. LDC code error correction perform error correction to LDC code).
Step 207
Determine if decoding is ok. If yes, go to step 209. If not, go to step 211.
Step 209
End.
Step 211
Decoding fails.

However, it is hard to have recursive decoding process like DVD system in a BD system, because the BD system is not an MLECC system. Accordingly, the error correction probability can not increase via recursive decoding operation.

SUMMARY OF THE INVENTION

One embodiment of present application discloses an error correction method for correcting an ECC code from a storage unit, which comprises: (a) marking at least a first part of the ECC code according to a correction result generated by correcting error of the ECC code, to generate a first error correction reference information; and (b) marking at least a second part of the ECC code according to the first error correction reference information to generate a second error correction reference information.

Another embodiment of the present application discloses an error correction method for correcting a LDC code from a storage unit, which comprises: (a) marking at least a first part of the LDC code according to a correction result generated by correcting error of the LDC code, to generate a first error correction reference information; (b) marking at least a second part of the LDC code according to the first error correction reference information to generate a second error correction reference information; and (c) correcting a part of the LDC code, which has error that was not corrected in the step (a), according to the second error correction reference information.

Another embodiment of the present application discloses an error correction apparatus for correcting an ECC code from a storage unit, which comprises: an error correction unit, for performing a first error correction operation to correct error of the ECC code; and an error correction reference information generator, for marking at least a first part of the ECC code according to the first error correction operation, to generate a first error correction reference information; and for marking at least a second part of the ECC code according to the first error correction reference information to generate a second error correction reference information.

Another embodiment of the present application discloses an error correction apparatus for correcting a LDC code from a storage unit, which comprises: an error correction unit, for performing a first error correction operation to correct error of the LDC code; and an error correction reference information generator, for marking at least a first part of the LDC code according to the first error correction operation, to generate a first error correction reference information; and for marking at least a second part of the LDC code according to the first error correction reference information to generate a second error correction reference information; wherein the error correction unit further performs a second error correction operation to correct a part of the LDC code, which has error that was not corrected in the first error correction operation, according to the second error correction reference information.

According to above-mentioned description, recursive error correction operations can be performed, such that the error correction performance can increase.

These and other objectives of the present invention will no doubt become obvious to those of ordinary skill in the art after

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 3:
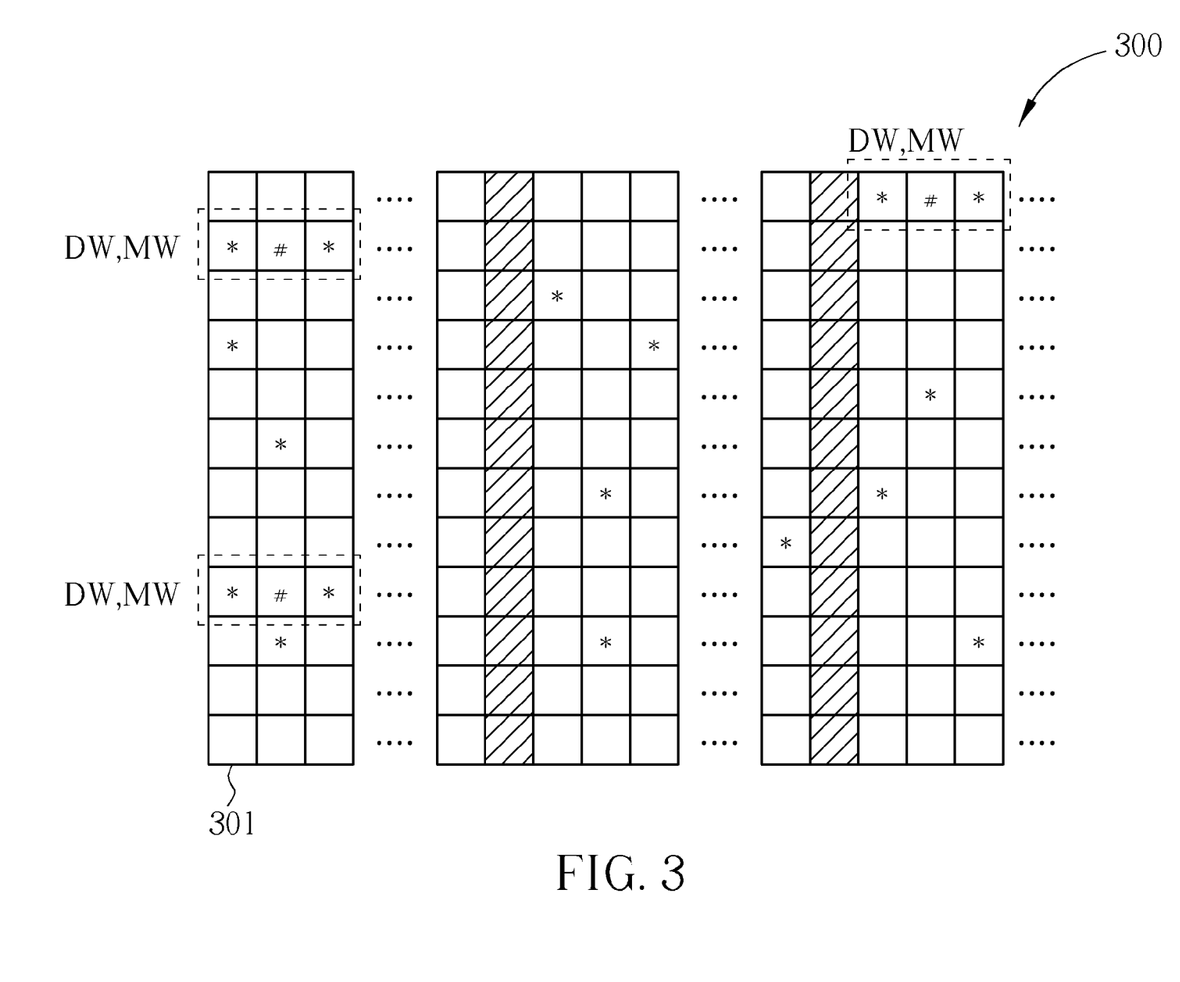
FIGS. 3-7 are schematic diagrams illustrating the code unit marking operation of the error correction method according to one embodiment of the present application.

FIGS. 3-7 are schematic diagrams illustrating the error correction method according to one embodiment of the present application. As shown in FIG. 3, ECC code 300 comprises a plurality of code units 301 (ex. byte). The code units of, for example, LDC code are performed error correction and a first part of them are marked by error symbols "*" (ex. raw LDC erasure flag) to generate a first error correction reference information. In a BD system, such error correction operation can be performed after the error correction operation for BIS subcode is performed. Alternatively, such error correction operation can be directly performed to LDC code without BIS code error correction is performed first. In one embodiment, the code units that are erroneous but corrected would be marked by the error symbol. However, different criteria of marking could be used for different design requirements. In this embodiment, a determination window DW is provided to determine the error density. In one embodiment, the error density is computed according to the number of code units marked by error symbols "*", for example, the number of marked code units in the determination window DW. However, different definition of error density could be used for different design requirements. In one embodiment, the more error symbols in the determination window DW, the higher error density is. Besides, a marked window MW is provided, and to generate a second error correction reference information, a second part of the ECC code 300, such as code unit in the marked window MW, is marked by mark symbol "#" (ex. LDC erasure flag) when the error density in the determination window DW is higher than a threshold value. In this embodiment, error density is employed as a criterion of mark symbol marking. However, other criteria of marking could be used for different design requirements, such as number of consecutive error symbols, distribution pattern of error symbols, etc. The threshold value and the size of the determination window DW and the marked window MW are adjustable. That is, the determination window DW and the marked window MW for different processes can have different threshold values and sizes. The marked window MW can be identical to the determination window DW, included in the determination window DW, or contains the determination window DW. Also, how to mark the code units in the mark window can be varied for different situations. It should be noted that, in this embodiment, the error symbol marking and the mark symbol marking are performed on the same ECC code 300.

Figure 4:
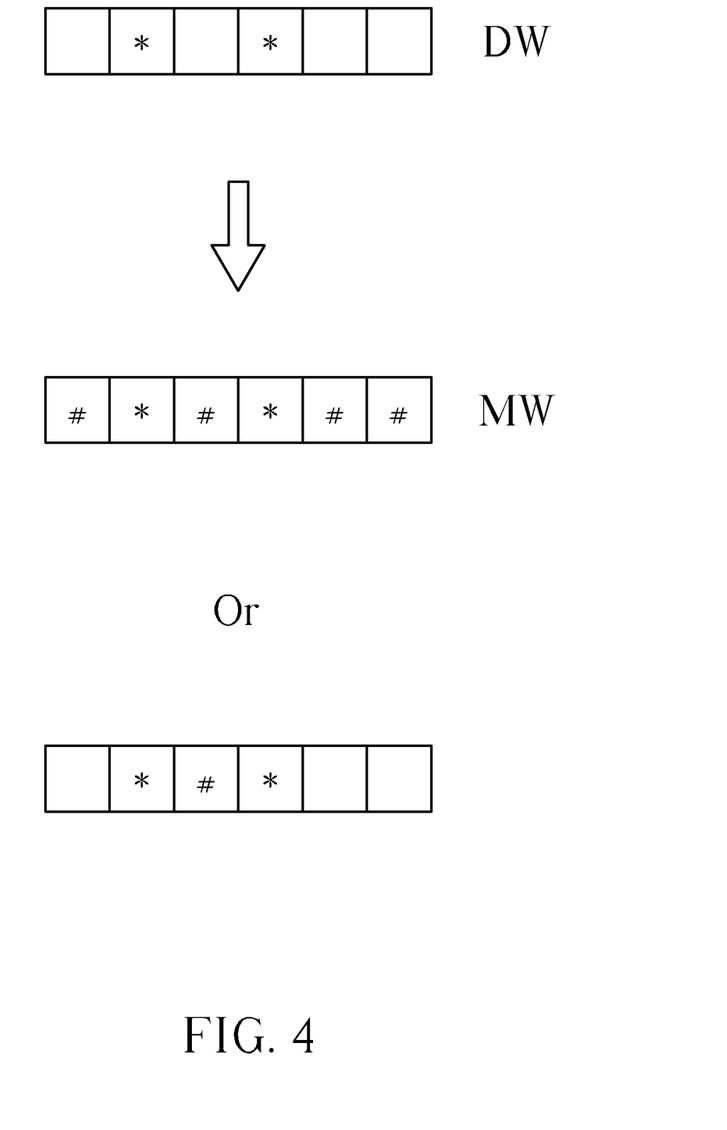
Figure 5:
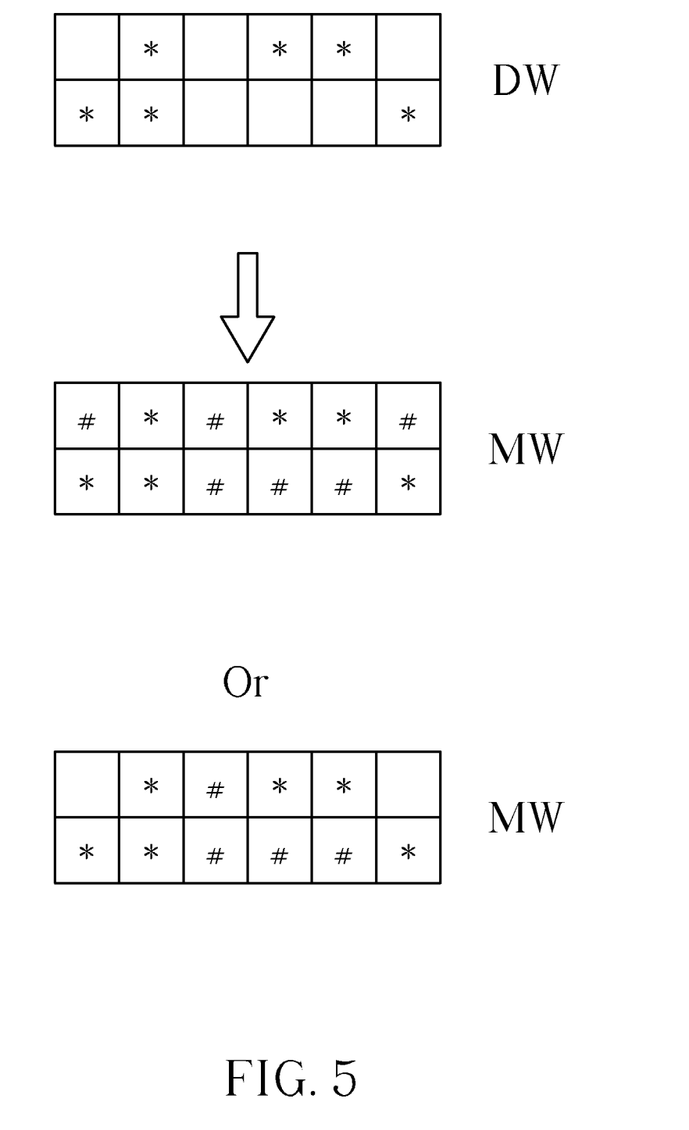
Figure 6:
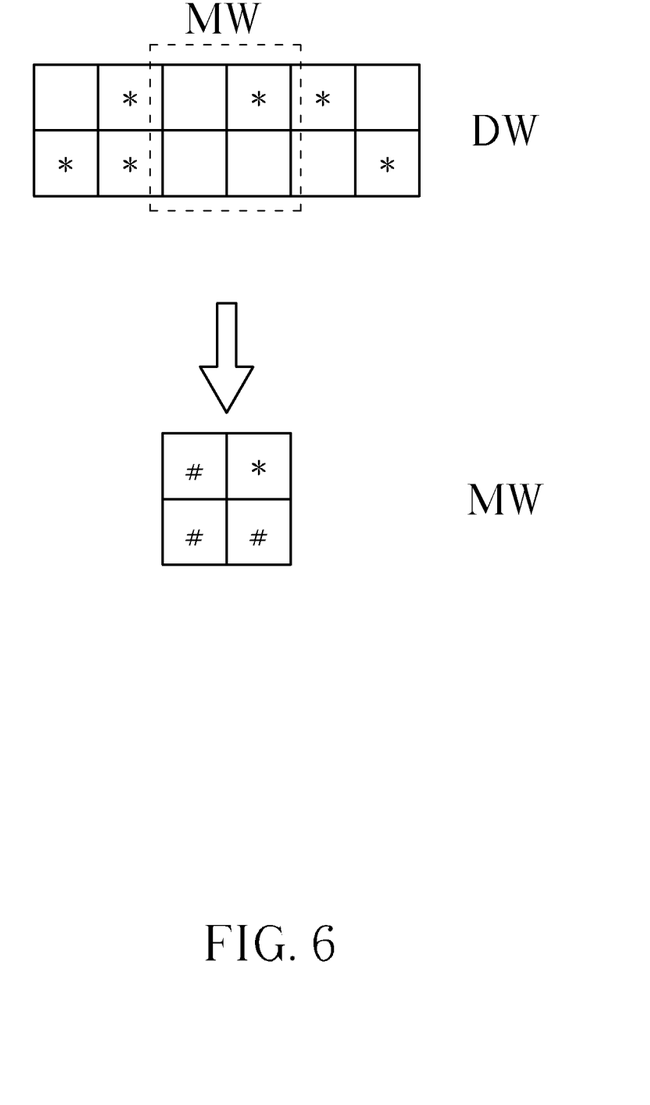
Figure 7:
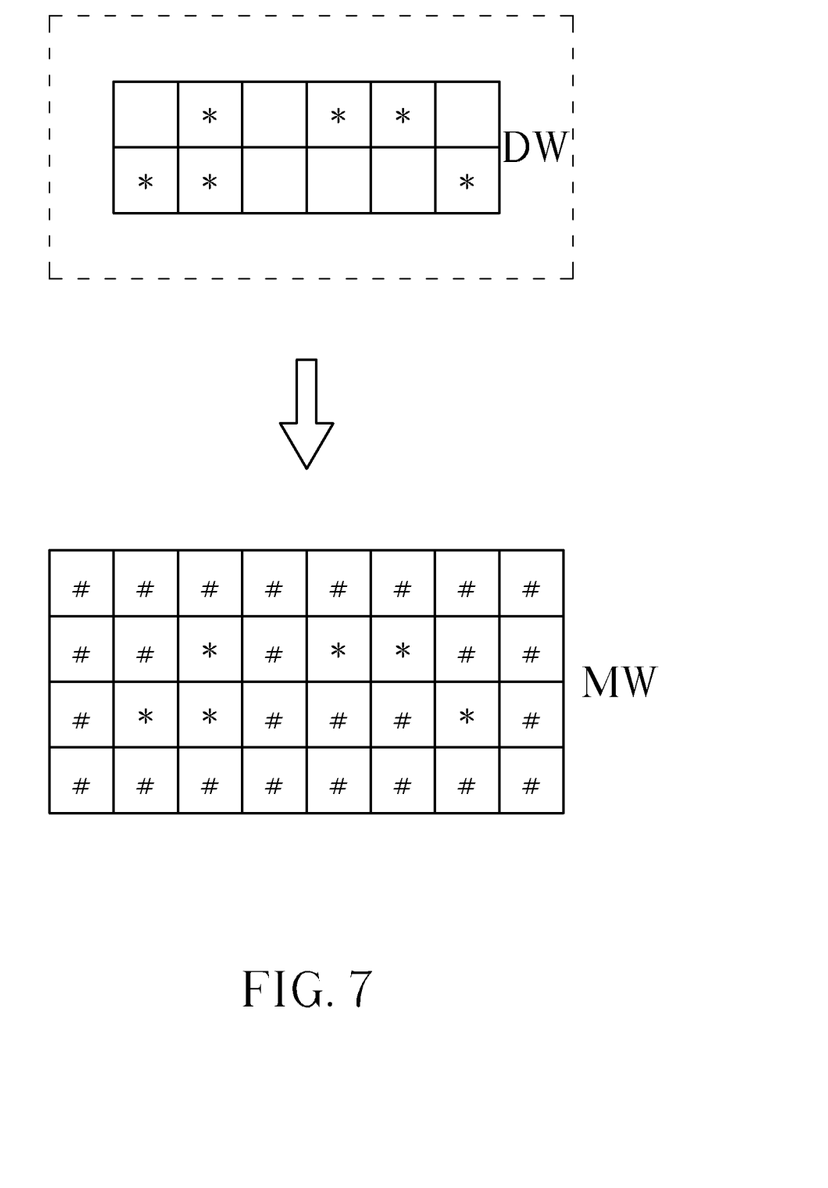

In the embodiment shown in FIG. 3, the marked window MW is identical to the determination window DW. In the MW, one or more of the code units having no error symbols are marked when the error density of the determination window DW is higher than a threshold value such as ⅔, or the code unit between two code units having error symbols "*" is marked. In the embodiment of FIG. 4, the marked window MW is also identical to the determination window DW. In this embodiment, the MW and DW are one dimensional. In the MW, one or more of the code units having no error symbols are marked when the error density of the determination window DW is higher than a threshold value, or the code unit between two code units having error symbols "*" is marked. Besides, in the embodiment of FIG. 5, the marked window MW is also identical to the determination window DW. However, the windows could be two dimensional instead of one dimensional windows in FIG. 4. In the MW, one or more of the code units having no error symbols are marked when the error density of the determination window DW is higher than a threshold value, or the code units between two code units having error symbols "*" are marked. Additionally, in the embodiment of FIG. 6, the marked window MW is included in the determination window DW. In MW, one or more of the code units having no error symbols are marked when the error density of the determination window DW is higher than a threshold value. Though both DW and MW are two dimensional in this embodiment, any one or both of them could be one dimensional. Furthermore, in the embodiment of FIG. 7, the determination window DW is included in the marked window MW. In MW, one or more of the code units having no error symbols are marked when the error density of the determination window DW is higher than a threshold value. Though both DW and MW are two dimensional in this embodiment, any one or both of them could be one dimensional. Besides, though in the embodiments shown in FIG. 6 or 7, the MW is entirely included in the DW or the DW is entirely included in the MW, the MW and the DW could partially overlap. That is, the MW could be partially included in the DW or the DW could be partially included in the MW.

After the ECC code 300 is marked by mark symbol "#" (ex. LDC erasure flag), error correction is performed again according to the second error correction reference information, such as LDC erasure flag. In some embodiments, such as very few code units are marked by error symbols "*", there may be no code units being marked by mark symbol "#". However, the error correction may be performed again as well. Besides, a code unit with LDC erasure flag can be regarded as a code unit that can not be corrected in the first LDC code error correction. Therefore the second LDC code error correction, can be regarded as error correction operation for the code units have error but not corrected in the first LDC code error correction. Besides, the result of the second error correction could be employed to update the first error correction reference information to generate an updated first error correction reference information. Then the second error correction reference information could be updated according to the updated first error correction reference information. And the error correction could be performed once again according to the updated second error correction reference information.

According to above-mentioned description, the error correction method (or called an ECC decoding method) according to one embodiment of the present application can be summarized as follows: (a) marking at least a first part of the ECC code (ex. the raw LDC erasure flag, symbol *) according to a correction result generated by correcting error of the ECC code, to generate a first error correction reference information; (b) marking at least a second part of the ECC code (ex. LDC erasure flag, symbol #) according to the first error correction reference information to generate a second error correction reference information. The ECC code comprises a plurality of codewords, which includes a lot of symbols. The codeword can also include data and parity. The codeword may consist of bytes.

In one embodiment, the error correction method can further comprise: before the step (a), correcting error of a second ECC code (ex. BIS code). Then the correcting error of the ECC code (ex. LDC code) in step (a) could be performed according to a result of the correction to the second ECC code. For example, The correcting error of the second ECC code (ex. BIS code) could generate a third error correction reference information such as a BIS erasure flag. Furthermore, a fourth error correction reference information (ex. LDC erasure flag) for the ECC code (ex. LDC code) could be generated according to the third error correction reference information (ex. BIS erasure flag). Then the correcting error of the ECC code (ex. LDC code) in step (a) could be performed referring to the fourth error correction reference information (ex. LDC erasure flag) or the third error correction reference information (ex. BIS erasure flag).

Alternatively, the error correction method according to one embodiment of the present application can also be summarized as follows: (a) Mark at least a first part of the ECC code according to a correction result generated by correcting error of the ECC code, to generate a first error correction reference information; (b) Mark at least a second part of the ECC code according to the first error correction reference information to generate a second error correction reference information. (c) Correct the ECC code, which has error that was not corrected in the step (a), according to the second error correction reference information.

It should be noted that the operation "marking" here does not limit to utilize a real symbol to mark the code unit. It can also mean recording the address of the code unit, and such operation can also indicate the operation "mark".

Figure 8:
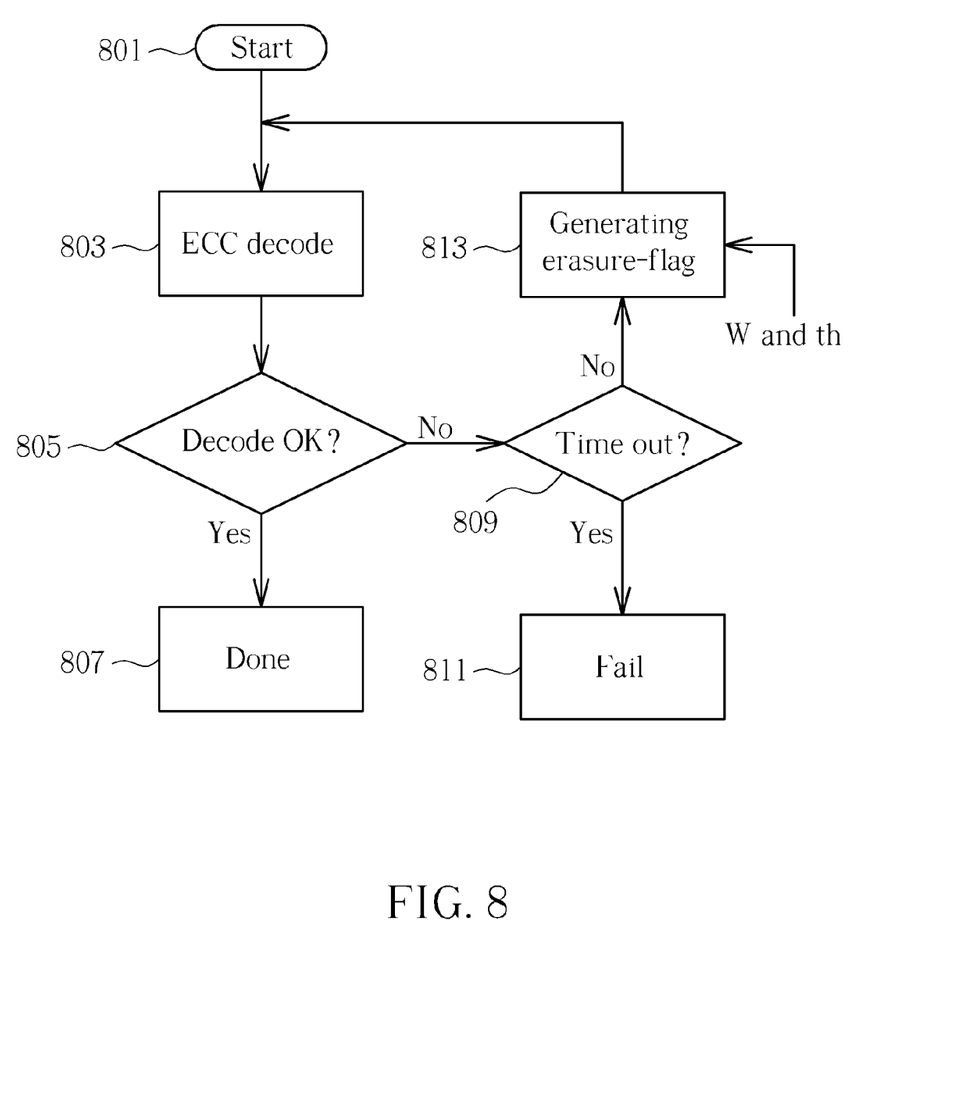
FIGS. 8 and 9 are flow chart illustrating error correction methods according to embodiments of the present application.
Figure 9:
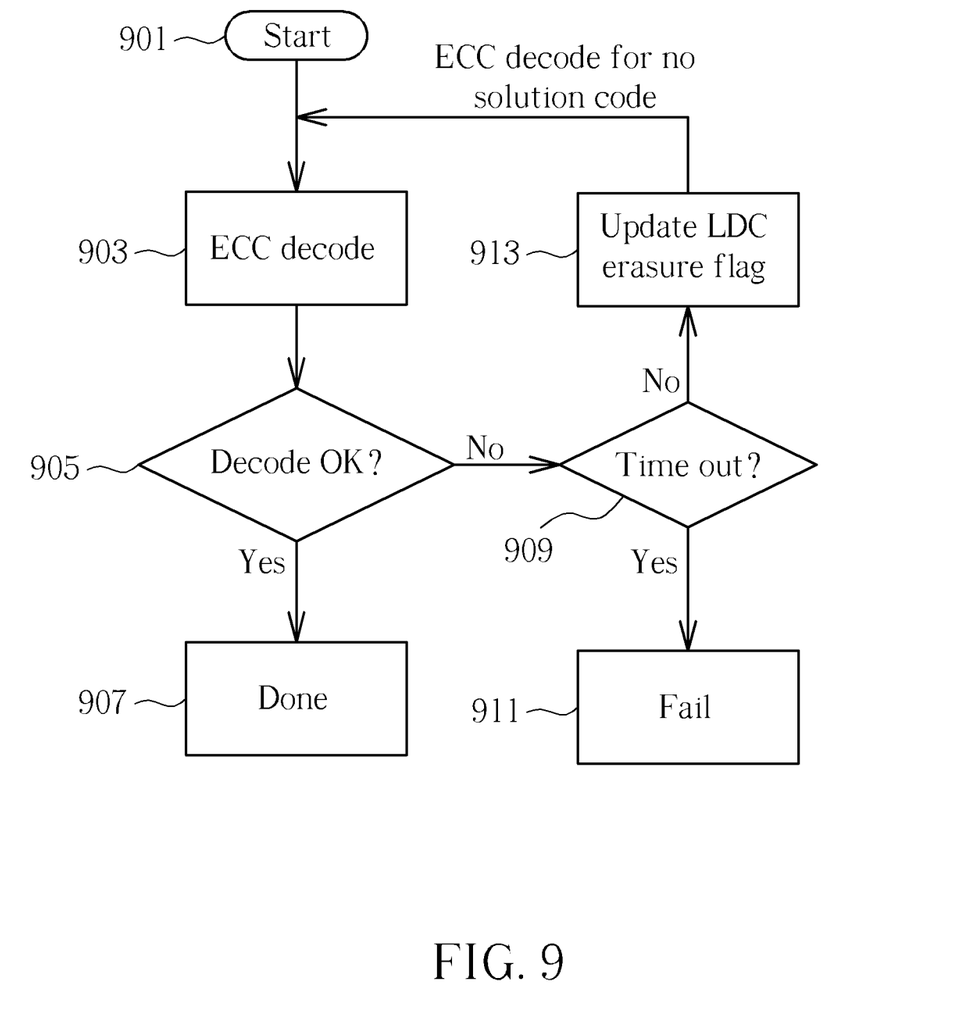

FIGS. 8-9 are flow charts illustrating detail steps of error correction methods according to embodiments of the present application. It should be noted that the following steps are only for example and do not mean to limit the scope of the present application.

As shown in FIG. 8, the error correction method includes:
Step 801
Start.
Step 803
Perform ECC decoding (ex. BIS subcode error correction and/or LDC code error correction).
Step 805
Determine if decoding is ok. If yes, go to step 807. If not, go to step 809.
Step 807
End.
Step 809
Is processing time over a threshold value? If yes, go to step 811. If not, go to step 813.
Step 811
Determine that decoding fails.
Step 813
Generate LDC erasure flag. The detail operations for generating LDC erasure flag can include, but not limited to the operations shown in FIGS. 3-7. After the LDC erasure flag is generated. Go to step 803 and the LDC code error correction will be performed according to LDC erasure flag again.

The error correction operation according to the embodiment of the present invention can be recursively performed. That is, after the first LDC code error correction for generating raw LDC erasure flag, and after the second LDC code error correction to the code units that still have errors via utilizing LDC erasure flag generated from the raw LDC erasure flag, a third LDC code error correction can be performed via utilizing the LDC erasure flag, to the code units that still have errors. The LDC erasure flag will be updated accordingly.

FIG. 9 discloses such recursive error correction steps. The error correction method according to the embodiment of the present invention disclosed in FIG. 9 comprises:
Step 901
Start.
Step 903
Perform ECC decoding (ex. BIS subcode error correction and/or LDC code error correction).
Step 905
Determine if decoding is ok. If decoding is ok, go to step 907. If decoding is not ok, go to step 909.
Step 907
End.
Step 909
Is processing time over a threshold value? If yes, go to step 911. If not, go to step 913.
Step 911
Decoding fails.
Step 913
Update LDC erasure flag. After the LDC erasure flag is updated.
Go to step 903 and the LDC code error correction will be performed according to LDC erasure flag again. In this case, the LDC code error correction will be performed to the code units having errors that is not corrected in the previous step 903 (i.e. the ECC decoding is performed for no solution code).

The steps 903, 905, 909 and 913 can be performed recursively until all the errors of the code units are corrected. Via such operations, the decoding performance can increase.

It should be noted that the present application is not limited to recursively perform error correction operation to LDC code. One embodiment of the present application can comprise: generating raw LDC erasure flag, generating LDC erasure flag according to the raw LDC erasure flag, perform LDC code error correction according to the LDC erasure flag; and then perform BIS subcode error correction, update the LDC erasure flag according to the correction result of the BIS subcode error correction, and then perform LDC code error correction again according to the updated LDC erasure flag, such variation should also fall in the scope of the present application.

Figure 10:
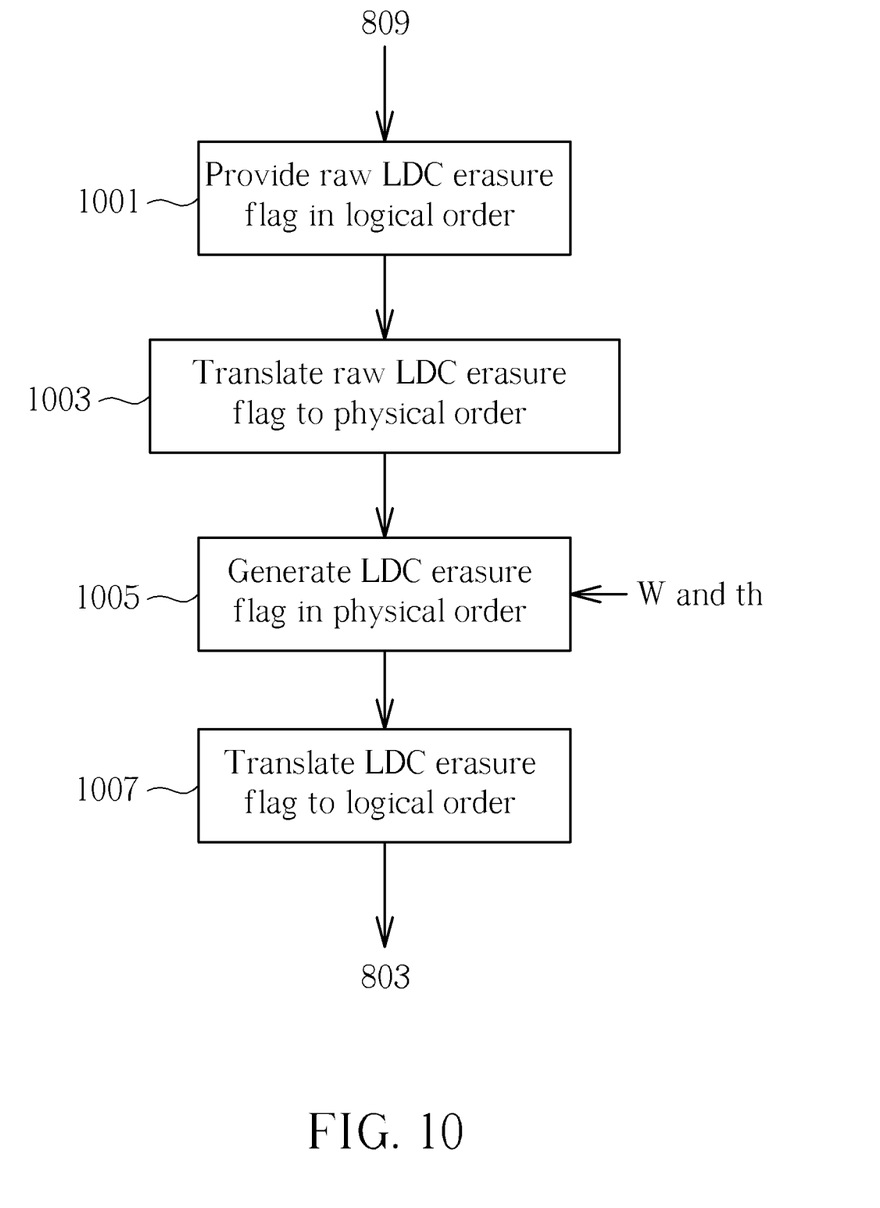
FIG. 10 is a flow chart illustrating the detail steps for the step of generating LDC erasure flag in FIG. 8 and the step of generating LDC erasure flag in FIG. 9.

FIG. 10 is a flow chart illustrating the detail steps for the step of generating LDC erasure flag in FIG. 8. FIG. 10 includes the steps of Step 1001

Provide raw LDC erasure flag in logic order of an ECC code.

Step 1003

Translate raw LDC erasure flag to physical order of the ECC code.

Step 1005

Generate LDC erasure flag in physical order of the ECC code.

Step 1007

Translate LDC erasure flag to logical order of the ECC code.

The term "physical order" means the real order in which the bytes or the code units are arranged on the disk. The term "logical order" indicates the order of ECC encoding. Via this encoding order, bytes belonging to the same LDC will be incorporated to the same group. The LDC erasure flag generated with W and th can be produced for code units in any order. In a preferred embodiment, the LDC erasure flag is generated for code units in physical order, since the neighboring bytes in physical order tends to have burst errors.

Figure 11:
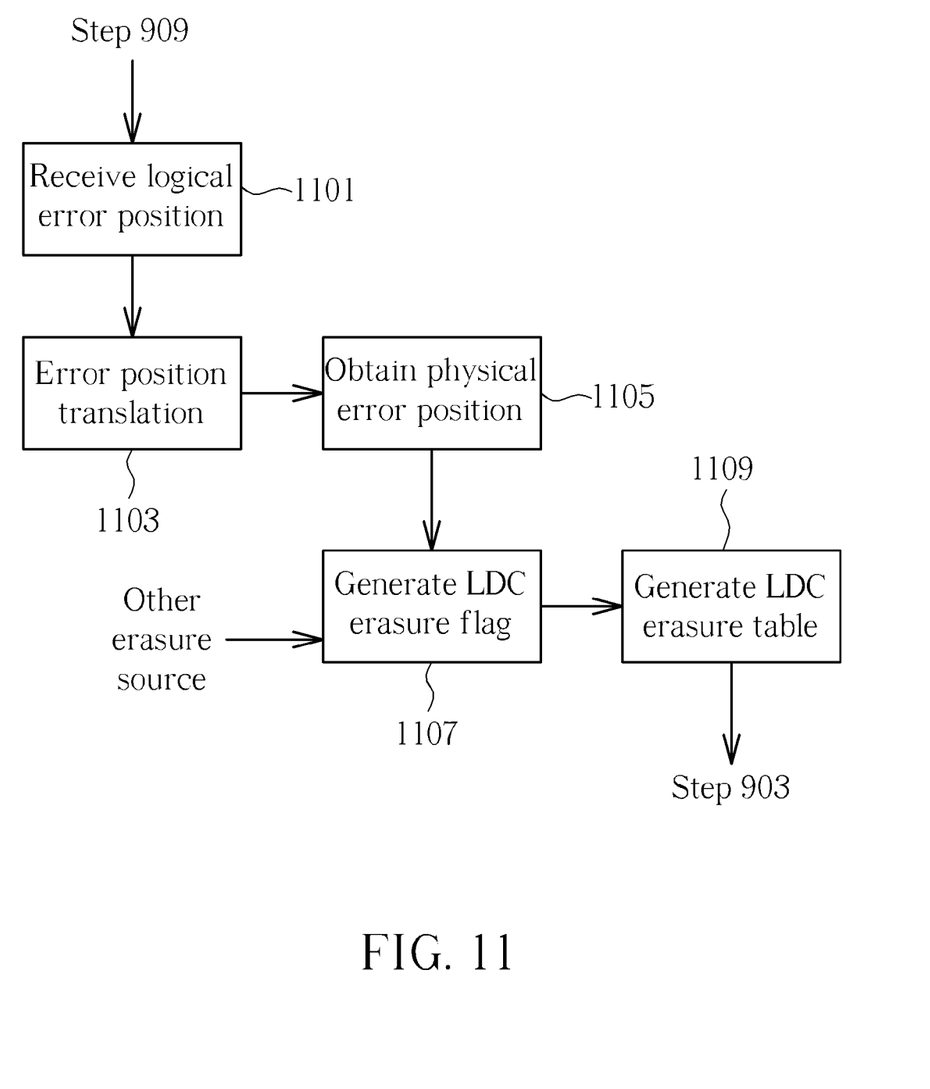
FIG. 11 is a flow chart illustrating the detail steps for the step of updating LDC erasure flag in FIG. 9.

FIG. 11 is a flow chart illustrating the detail steps for the step of updating LDC erasure flag in FIG. 9. Besides updating LDC erasure flag, these steps apply to generating LDC erasure flag as well. FIG. 11 includes the steps of:

Step 1101

Receive logical position of error code units.

Step 1103

Translate logical position to physical position.

Step 1105

Obtain physical position of error code units.

Step 1107

Generate LDC erasure flag and related LDC erasure information according to the physical position from the step 1105 and other erasure source, such as raw LDC erasure flag and/or BIS erasure flag. Thus the LDC erasure flag is updated.

Step 1109

Generate LCD erasure table including error locations.

Comparing with related art, the erasure table generated from LCD code is more precise than which generated from BIS code, since the number of BIS code is less than LDC code. Besides, in some embodiments, steps 1103 and 1105 can be merged, and steps 1107 and 1109 can be merged.

Figure 12:
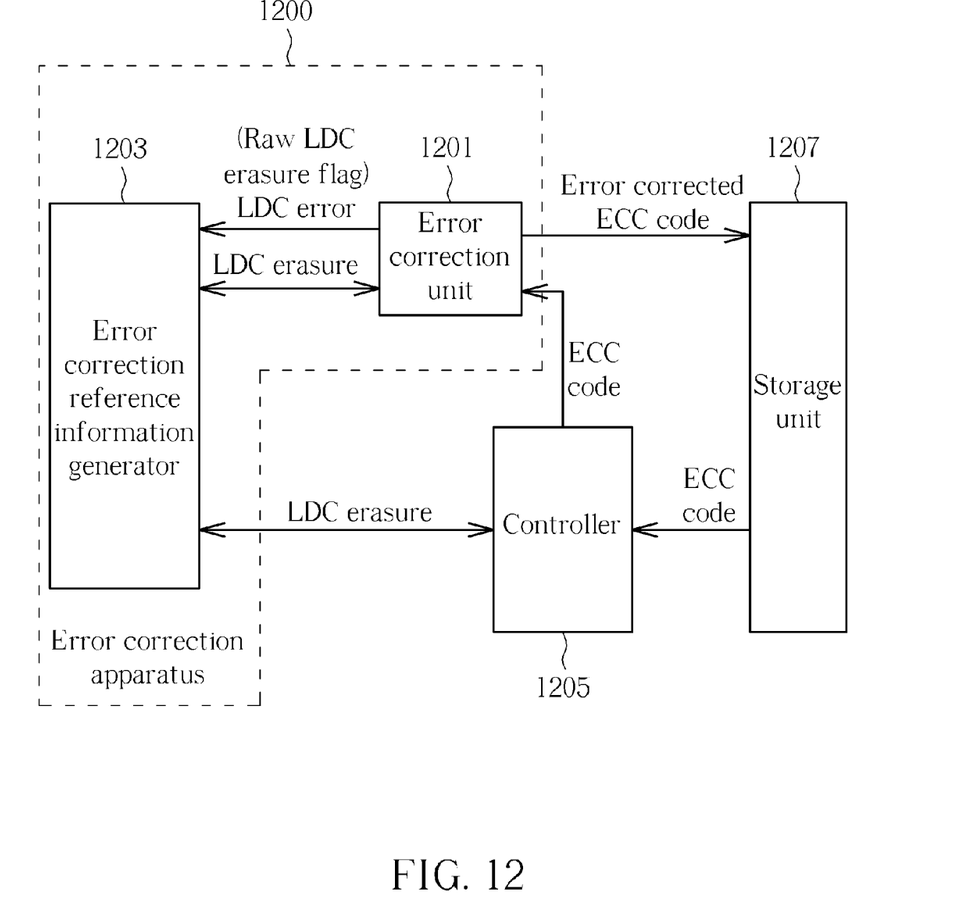
FIG. 12 is a block diagram illustrating an error correction apparatus according to one embodiment of the present application.

FIG. 12 is a block diagram illustrating an error correction apparatus 1200 according to one embodiment of the present application. As shown in FIG. 12, the error correction apparatus 1200 includes an error correction unit 1201 (a decoder in this embodiment) and an error correction reference information generator 1203 (a LDC erasure generating unit in this embodiment). The error correction unit 1201 performs an error correction operation to correct error of the ECC code. The error correction reference information generator 1203 marks at least a first part of the ECC code according to the correction result of the error correction operation to generate a first error correction reference information (ex. raw LDC erasure flag). The error correction reference information generator 1203 further marks at least a second part of the ECC code according to the first error correction reference information to generate a second error correction reference information (ex. LDC erasure flag). In another embodiment, the error correction unit 1201 further performs an error correction operation to correct a part of the ECC code, which has error that was not corrected in the previous error correction operation, according to the second error correction reference information.

In this embodiment, the LDC erasure flag generated from the error correction reference information generator 1203 is further transmitted to a controller 1205, which controls the operation of the error correction unit 1201 and transmits the ECC code from a storage unit 1207. The storage unit 1207 can be a BD or a DRAM in this embodiment, and the storage unit 1207 also receives error corrected ECC code (ex. decoded ECC code) from the error correction unit 1201. Though in this embodiment, the first error correction reference information is generated by the error correction reference information generator 1203, the first error correction reference information could be generated by the error correction unit 1201 instead. It should be noted that the structures disclosed in FIG. 12 is only for example and does not mean to limit the scope of the present application.

Besides, the above mentioned embodiments are not limited to be applied to a BD system. For example, the embodiments of the application can be applied to an optical disc with only one code (ex. LDC code).

According to above-mentioned description, recursive error correction operations can be performed to a storage unit with only one error correction code or MLECC, such that the error correction performance can increase.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An error correction method for correcting a first ECC code from a storage unit, comprising:
    (a) marking at least a first part of the first ECC code according to a correction result generated by a first correcting step that corrects error of the first ECC code, to generate a first error correction reference information, wherein the first error correction reference information identifies a location of the error corrected by the first correcting step; and
    (b) marking at least a second part of the first ECC code according to the first error correction reference information to generate a second error correction reference information.

2. The error correction method of claim 1, wherein the storage unit is a blue ray disc, and the first ECC code is LDC code.

3. The error correction method of claim 1, further comprising:
    (c) correcting error of the first ECC code according to the second error correction reference information.

4. The error correction method of claim 3, wherein the step (c) corrects a part of the first ECC code, which has error that was not corrected.

5. The error correction method of claim 4, further comprising:
    updating the first error correction reference information according to a result of the step (c) to generate an updated first error correction reference information;
    updating the second error correction reference information according to the updated first error correction reference information; and
    correcting the first ECC code according to the updated second error correction reference information.

6. The error correction method of claim 1, wherein the first ECC code includes a plurality of code units, and erroneous but corrected ones of the code units are marked in the step (a).

7. The error correction method of claim 6, wherein an error density is computed according to a number of the erroneous but corrected code units in a determination window, and the step (b) marks at least one of the code units in a marked window when the error density is not smaller than a threshold value.

8. The error correction method of claim 7, wherein the determination window, the threshold value and the marked window are adjustable.

9. The error correction method of claim 7, wherein the step (b) marks a code unit located between two erroneous but corrected code units.

10. The error correction method of claim 7, wherein the marked window is identical to the determination window.

11. The error correction method of claim 7, wherein at least a portion of the marked window is included in the determination window.

12. The error correction method of claim 7, wherein at least a portion of the determination window is included in the marked window.

13. The error correction method of claim 1, wherein the step (b) is performed in a physical order of the first ECC code.

14. The error correction method of claim 1, further comprising a step (d) before the step (a), wherein the step (d) comprises:
   correcting error of a second ECC code;
   wherein the first correcting step is performed according to a result of the step (d).

15. An error correction method for correcting a LDC code from a storage unit, comprising:
   (a) marking at least a first part of the LDC code according to a correction result generated by correcting error of the LDC code, to generate a first error correction reference information;
   (b) marking at least a second part of the LDC code according to the first error correction reference information to generate a second error correction reference information; and
   (c) correcting a part of the LDC code, which has error that was not corrected in the step (a), according to the second error correction reference information.

16. The error correction method of claim 15, further comprising:
   updating the first error correction reference information according to a result of the step (c) to generate an updated first error correction reference information;
   updating the second error correction reference information according to the updated first error correction reference information; and
   correcting the LDC code according to the updated second error correction reference information.

17. The error correction method of claim 15, wherein the step (b) is performed in a physical order of the LDC code.

18. The error correction method of claim 15, wherein the LDC code includes a plurality of code units, and erroneous but corrected ones of the code units are marked in the step (a).

19. The error correction method of claim 18, wherein an error density is computed according to a number of the erroneous but corrected code units in a determination window, and the step (b) marks at least one of the code units in a marked window when the error density is not smaller than a threshold value.

20. The error correction method of claim 19, wherein the determination window, the threshold value and the marked window are adjustable.

21. The error correction method of claim 19, wherein the step (b) marks a code unit located between two erroneous but corrected code units.

22. The error correction method of claim 19, wherein the marked window is identical to the determination window.

23. The error correction method of claim 19, wherein at least a portion of the marked window is included in the determination window.

24. The error correction method of claim 19, wherein at least a portion of the determination window is included in the marked window.

25. The error correction method of claim 15, further comprising a step (d) performed before the step (a), wherein the step (d) comprising:
   correcting error of a BIS code;
   wherein the correcting error of the LDC code in step (a) is performed according to a result of the step (d).

26. An error correction apparatus for correcting an first ECC code from a storage unit, comprising:
   an error correction unit, for performing a first error correction operation to correct error of the first ECC code; and
   an error correction reference information generator, for marking at least a first part of the first ECC code according to the first error correction operation, to generate a first error correction reference information; and for marking at least a second part of the first ECC code according to the first error correction reference information to generate a second error correction reference information; wherein the first error correction reference information identifies a location of the error corrected by the first correcting step.

27. The error correction apparatus of claim 26, wherein the storage unit is a blue ray disc, and the code is LDC code.

28. The error correction apparatus of claim 26, wherein the error correction unit further performs a second error correction operation to correct error of the first ECC code according to the second error correction reference information.

29. The error correction apparatus of claim 28, wherein the second error correction operation corrects a part of the first ECC code, which has error that was not corrected in the first error correction operation.

30. The error correction apparatus of claim 29, wherein the error correction reference information generator updates the first error correction reference information according to a result of the step (c) to generate an updated first error correction reference information, updates the second error correction reference information according to the updated first error correction reference information; and the error correction unit corrects the first ECC code according to the updated second error correction reference information.

31. The error correction apparatus of claim 26, wherein the first ECC code includes a plurality of code units, and erroneous but corrected ones of the code units are marked by the error correction reference information generator.

32. The error correction apparatus of claim 31, wherein an error density is computed according to a number of the erroneous but corrected code units in a determination window, and the error correction reference information generator marks at least one of the code units in a marked window when the error density is not smaller than a threshold value.

33. The error correction apparatus of claim 32, wherein the determination window, the threshold value and the marked window are adjustable.

34. The error correction apparatus of claim 32, wherein the error correction reference information generator marks a code unit located between two error code units.

35. The error correction apparatus of claim 32, wherein the marked window is identical to the determination window.

36. The error correction apparatus of claim 32, wherein at least a portion of the marked window is included in the determination window.

37. The error correction apparatus of claim 32, wherein at least a portion of the determination window is included in the marked window.

38. The error correction apparatus of claim 26 wherein the error correction reference information generator marks the first ECC code in a physical order of the first ECC code.

39. The error correction apparatus of claim 26, wherein the error correction unit performs a third error correction operation to a second ECC code before performing the first error correction operation, and the error correction unit performs the first error correction operation according to a result of the third error correction operation.

40. An error correction apparatus for correcting a LDC code from a storage unit, comprising:
    an error correction unit, for performing a first error correction operation to correct error of the LDC code; and
    an error correction reference information generator, for marking at least a first part of the LDC code according to the first error correction operation, to generate a first error correction reference information; and for marking at least a second part of the LDC code according to the first error correction reference information to generate a second error correction reference information;
    wherein the error correction unit further performs a second error correction operation to correct a part of the LDC code, which has error that was not corrected in the first error correction operation, according to the second error correction reference information.

41. The error correction apparatus of claim 40, wherein the error correction reference information generator updates the first error correction reference information according to a result of the step (c) to generate an updated first error correction reference information, updates the second error correction reference information according to the updated first error correction reference information; and the error correction unit corrects the LDC code according to the updated second error correction reference information.

42. The error correction apparatus of claim 40, wherein the error correction reference information generator marks the LDC code in a physical order of the LDC code.

43. The error correction apparatus of claim 40, wherein the LDC code includes a plurality of code units, and erroneous but corrected ones of the code units are marked by the error correction reference information generator.

44. The error correction apparatus of claim 43, wherein an error density is computed according to a number of the erroneous but corrected code units in a determination window, and the error correction reference information generator marks at least one of the code units in a marked window when the error density is not smaller than a threshold value.

45. The error correction apparatus of claim 44, wherein the determination window, the threshold value and the marked window are adjustable.

46. The error correction apparatus of claim 44, wherein the error correction reference information generator marks a code unit located between two error code units.

47. The error correction apparatus of claim 44, wherein the marked window is identical to the determination window.

48. The error correction apparatus of claim 44, wherein at least a portion of the marked window is included in the determination window.

49. The error correction apparatus of claim 44, wherein at least a portion of the determination window is included in the marked window.

50. The error correction apparatus of claim 40, wherein the error correction unit performs a third error correction operation to a BIS code before performs the first error correction operation, and the error correction unit performs the first error correction operation according to a result of the third error correction operation.

51. An error correction method for correcting a first ECC code from a storage unit, comprising:
    (a) marking at least a first part of the first ECC code according to a correction result generated by correcting error of the first ECC code, to generate a first error correction reference information;
    (b) marking at least a second part of the first ECC code according to the first error correction reference information to generate a second error correction reference information; and
    (c) correcting a part of the first ECC code, which has error that was not corrected in the step (a), according to the second error correction reference information.

52. An error correction apparatus for correcting a first ECC code from a storage unit, comprising:
    an error correction unit, for performing a first error correction operation to correct error of the first ECC code; and
    an error correction reference information generator, for marking at least a first part of the first ECC code according to the first error correction operation, to generate a first error correction reference information; and for marking at least a second part of the first ECC code according to the first error correction reference information to generate a second error correction reference information;
    wherein the error correction unit further performs a second error correction operation to correct a part of the first ECC code, which has error that was not corrected in the first error correction operation, according to the second error correction reference information.

* * * * *